(12) United States Patent
Lai et al.

(10) Patent No.: US 9,673,156 B2
(45) Date of Patent: Jun. 6, 2017

(54) PACKAGE STRUCTURE

(71) Applicant: Delta Electronics Int'l (Singapore) Pte Ltd, Singapore (SG)

(72) Inventors: Yiu-Wai Lai, Singapore (SG); Da-Jung Chen, Singapore (SG)

(73) Assignee: DELTA ELECTRONICS INT'L (SINGAPORE) PTE LTD, Singapore (SG)

(*) Notice: Subject to any disclaimer, the term of this patent is extended or adjusted under 35 U.S.C. 154(b) by 0 days.

(21) Appl. No.: 15/015,711

(22) Filed: Feb. 4, 2016

(65) Prior Publication Data

US 2016/0233140 A1 Aug. 11, 2016

(30) Foreign Application Priority Data

Feb. 10, 2015 (SG) .............................. 10201501021P (51) Int. Cl.
| | |
|---|---|
| H01L 23/34 | (2006.01) |
| H01L 23/00 | (2006.01) |
| H01L 23/13 | (2006.01) |
| H01L 23/36 | (2006.01) |
| H01L 23/538 | (2006.01) |

(52) U.S. Cl.
CPC .............. *H01L 24/02* (2013.01); *H01L 23/13* (2013.01); *H01L 23/36* (2013.01); *H01L 23/5383* (2013.01); *H01L 23/5389* (2013.01); *H01L 2224/0239* (2013.01); *H01L 2224/04105* (2013.01); *H01L 2224/24195* (2013.01); *H01L 2224/73267* (2013.01); *H01L 2924/19105* (2013.01)

(58) Field of Classification Search
CPC . H01L 2224/73267; H01L 2224/24195; H01L 2224/16225; H01L 2224/3225; H01L 2224/73265; H01L 2224/48091; H01L 2224/48227; H01L 2224/73204; H01L 2224/32145; H01L 23/13; H01L 23/36; H01L 23/5389; H01L 23/49816; H01L 23/3128; H01L 23/49827; H01L 23/481; H01L 23/50; H01L 24/02; H01L 24/49; H01L 24/85; H01L 2924/19105; H01L 2924/142; H01L 2924/386
See application file for complete search history.

(56) References Cited

U.S. PATENT DOCUMENTS

2016/0284642 A1* 9/2016 Ganesan ............. H01L 23/3171

* cited by examiner

*Primary Examiner* — (Vikki) Hoa B Trinh
(74) *Attorney, Agent, or Firm* — Kirton McConkie; Evan R. Witt (57) ABSTRACT

A package structure includes a first insulation layer, at least one first electronic component, and a first re-distribution layer. The first electronic component is embedded within the first insulation layer, and the first electronic component includes plural first conducting terminals disposed on a bottom surface of the first electronic component. At least part of the bottom surface of the first electronic component is exposed from a bottom surface of the first insulation layer. The first re-distribution layer is formed on the bottom surface of the first insulation layer and contacted with the corresponding first conducting terminals.

14 Claims, 6 Drawing Sheets

PACKAGE STRUCTURE

FIELD OF THE INVENTION

The present invention relates to a package structure, and more particularly to a package structure of a power electronic module.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single electronic module. For example, a power module is one of the widely-used electronic modules. An example of the power module includes but is not limited to a DC-to-DC converter, a DC-to-AC converter or an AC-to-DC converter. After the electronic components (e.g. capacitors, resistors, inductors, transformers, diodes and transistors) are integrated as a power module, the power module may be installed on a motherboard or a system circuit board.

Conventionally the electrical connection inside an electronic module is made by wire bonding. Recently an embedded approach, which is without any bonding wire, is being employed in packaging to further reduce the package footprint and enhance the performance at the same time.

An embedded package structure of the power module will be illustrated as follows. In the package structure, an electronic component with at least one conducting terminal is disposed on a first surface of a substrate, and a first insulation layer is disposed on the first surface of the substrate. If necessary, a second insulation layer is disposed on a second surface of the substrate. The electronic component is covered by the first insulation layer. For allowing the conducting terminal to be connected with an external circuit, at least one conductive via is formed in the first insulation layer by a laser drilling process. Moreover, after the at least one conductive via is cleaned by a desmearing process with a chemical agent, a conductive material is formed in the conductive via by a filling process or an electroplating process. Consequently, the conducting terminal of the electronic component may be connected with the external circuit through the conductive via.

As mentioned above, for allowing the conducting terminal of the embedded electronic component to be connected with the external circuit, the conductive via is formed in the first insulation layer by the laser drilling process, and the conductive via is cleaned by the desmearing process with the chemical agent. Since copper has excellent resistance to the laser drilling process, the conducting terminal of the electronic component of the embedded package structure is usually made of copper. In other words, the possibility of causing damage of the conducting terminal of the electronic component during the laser drilling process will be minimized. Moreover, since copper has excellent resistance to the chemical agent during the desmearing process, the possibility of causing corrosion by the chemical agent will be minimized. Moreover, the native oxide layer on the copper surface is easily removable by etching process.

However, since the conducting terminal of the embedded electronic component of the package structure is made of copper, the type of the electronic component is restricted. If the conducting terminal is made of a non-copper metallic material, the electronic component cannot be directly embedded within the package structure. In particular, if the conducting terminal of the electronic component is made of the non-copper metallic material and the electronic component needs to be embedded in the package structure, the conducting terminal of the electronic component should be firstly treated and then replaced by copper. Under this circumstance, the fabricating process of the package structure is complicated.

Therefore, there is a need of providing an improved package structure in order to eliminate the above drawbacks.

SUMMARY OF THE INVENTION

The present invention provides a package structure with an electronic component and a re-distribution layer. The conducting terminals of the electronic component are electrically connected with the external circuit through the re-distribution layer. Consequently, the conducting terminals of the electronic component may be made of a non-copper metallic material. The drawbacks of the copper-based conducting terminals will be overcome.

The present invention provides a package structure with high integration density and enhanced heat dissipation efficiency.

The present invention provides a package structure applicable to the system circuit board with various trace configurations, so that the applications thereof are extensive.

An aspect of the present invention provides a package structure. The package structure includes a first insulation layer, at least one first electronic component and a first re-distribution layer. The first electronic component is embedded within the first insulation layer, and the first electronic component includes plural first conducting terminals disposed on a bottom surface of the first electronic component. At least part of the bottom surface of the first electronic component is exposed from a bottom surface of the first insulation layer. The first re-distribution layer is formed on the bottom surface of the first insulation layer and contacted with the corresponding first conducting terminals.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
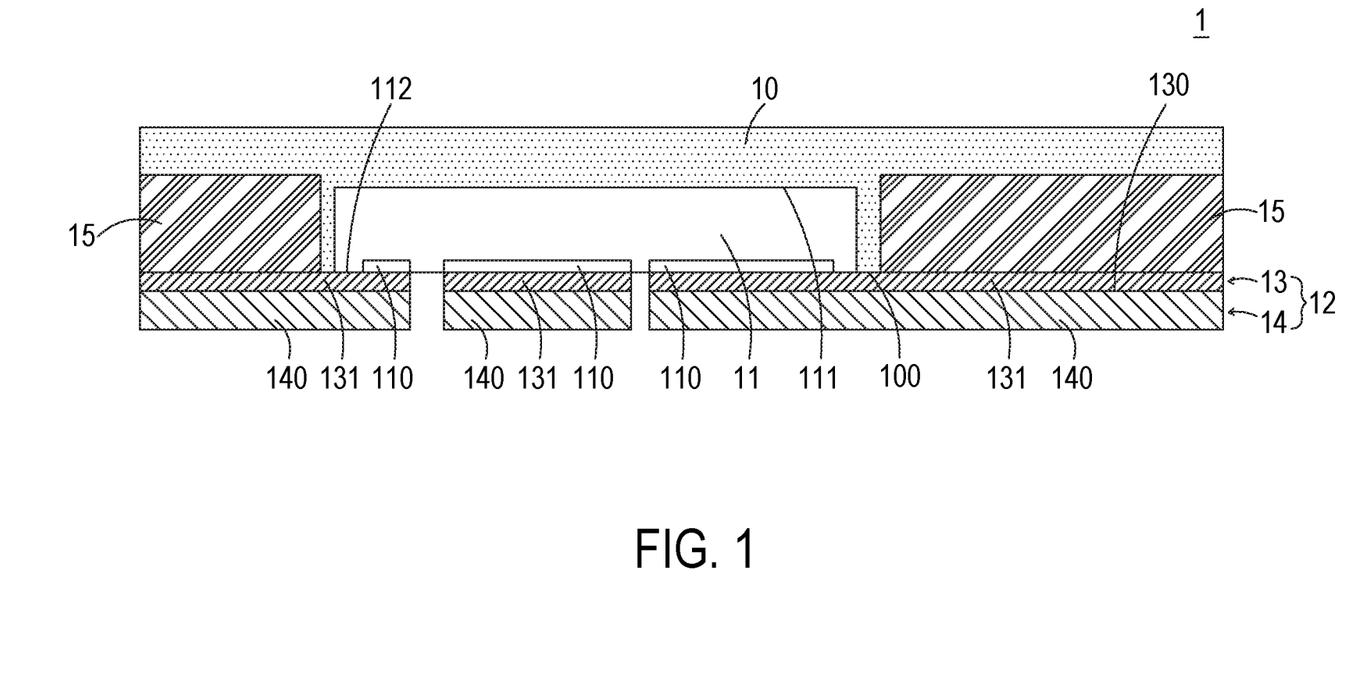
FIG. 1 is a schematic cross-sectional view illustrating a package structure according to a first embodiment of the present invention.

FIG. 1 is a schematic cross-sectional view illustrating a package structure according to a first embodiment of the present invention. As shown in FIG. 1, the package structure 1 comprises a first insulation layer 10, at least one first electronic component 11, and a first re-distribution layer (RDL) 12. In an embodiment, the first insulation layer 10 is made of resin, prepreg, molding compound, epoxy, epoxy with filler or any other appropriate insulation material with high thermal conductivity.

The first electronic component 11 is embedded within the first insulation layer 10. Moreover, the first electronic component 11 comprises plural first conducting terminals 110. The plural first conducting terminals 110 are made of aluminum, silver or any other appropriate metallic material (e.g. copper). Moreover, the first conducting terminals 110 are disposed on a top surface 111 of the first electronic component 11 (see FIG. 5) and/or a bottom surface 112 of the first electronic component 11 (see FIG. 1). In this embodiment, the first insulation layer 10 has a recess adjacent to a bottom surface 100 of the first insulation layer 10, and the first electronic component 11 is disposed in the recess. The bottom surface 112 of the first electronic component 11 is approximately at the same level with that of the first insulation layer 10, and the first conducting terminals 110 on the bottom surface 112 of the first electronic component 11 are located beside the bottom surface 100 of the first insulation layer 10 and exposed to the bottom surface 100 of the first insulation layer 10.

The first electronic component 11 is an active component or a passive component. An example of the first electronic component 11 includes but is not limited to an integrated circuit chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The number of the first conducting terminals 110 of the first electronic component 11 is determined according to the type and the configuration of the first electronic component 11. As shown in FIG. 1, the first electronic component 11 is an integrated circuit (IC) chip. According to the configuration of the IC chip, the first electronic component 11 has three first conducting terminals 110.

In an embodiment of the invention, the first re-distribution layer 12 comprises a first metal layer 13 and a second metal layer 14. The first metal layer 13 is used as an adhesion layer or a diffusion barrier or both. The first metal layer 13 is made of copper, nickel-chromium alloy, Ti, TiW, Cr, Ni, or any other appropriate metallic material, such as a combination of above. Moreover, the first metal layer 13 is disposed on the bottom surface 100 of the first insulation layer 10 and contacted with the first conducting terminals 110.

The second metal layer 14 is disposed on a bottom surface 130 of the first metal layer 13 and contacted with the first metal layer 13. The second metal layer 14 is thicker than the first metal layer 13. Moreover, the second metal layer 14 is made of copper or any other appropriate metallic material.

Moreover, the first metal layer 13 and the second metal layer 14 are patterned to form one or more conductive traces. In this embodiment as shown in FIG. 1, the first re-distribution layer 12 comprises three separate conductive traces. Namely, the first metal layer 13 comprises three separate first conductive traces 131, and the second metal layer 14 comprises three separate second conductive traces 140. The first conductive traces 131 are contacted with the corresponding first conducting terminals 110. The second conductive traces 140 are contacted with the corresponding first conductive traces 131. Consequently, the second conductive traces 140 are electrically connected with the corresponding first conducting terminals 110 through the corresponding first conductive traces 131. The second conductive traces 140 may be served as contact pads of the package structure 1. Consequently, the package structure 1 may be mounted on a system circuit board (not shown) by a surface mount technology.

From the above descriptions, the first conducting terminals 110 of the first electronic component 11 within the first insulation layer 10 are contacted with the corresponding first conductive traces 131 of the first metal layer 13, and the second metal layer 14 is contacted with the bottom surface 130 of the first metal layer 13. Consequently, the second conductive traces 140 of the second metal layer 14 are also contacted with the corresponding first conductive traces 131 of the first metal layer 13. Under this circumstance, the first conducting terminals 110 of the first electronic component 11 are electrically connected with the corresponding second conductive traces 140 through the corresponding first conductive traces 131. Since the second conductive traces 140 are served as contact pads of the package structure 1, the package structure 1 may be mounted on the system circuit board by a surface mount technology. After the package structure 1 is mounted on the system circuit board, the first conducting terminals 110 of the first electronic component 11 are electrically connected with the electronic components (not shown) or traces (not shown) of the system circuit board through the corresponding first conductive traces 131 and the corresponding second conductive traces 140. Consequently, for allowing the first conducting terminals 110 of the first electronic component 11 to be electrically connected with the external circuit, it is not necessary to form conductive vias in the package structure 1. In other words, the laser drilling process and the desmearing process to treat the package structure can be omitted by the technology of the present invention. Under this circumstance, the first conducting terminals 110 of the first electronic component 11 of the package structure 1 may be made of a non-copper metallic material (e.g. aluminium or silver). Since it is not necessary to additionally treat the first conducting terminals 110 of the first electronic component 11, the applications of the package structure 1 of the present invention are more extensive. Moreover, since the laser drilling process, the desmearing process, the filling process and the electroplating process are omitted, the method of fabricating the package structure 1 of the present invention is simplified.

The package structure 1 of the present invention further comprises at least one thermal conduction structure 15. As shown in FIG. 1, the package structure 1 comprises plural thermal conduction structures 15. The plural thermal conduction structures 15 are embedded within the first insulation layer 10. Moreover, the plural thermal conduction structures 15 are located at least a side of the first electronic component 11. For example, the plural thermal conduction structures 15 are arranged around the first electronic component 11. Moreover, the thermal conduction structures 15 are exposed outside the first insulation layer 10. Consequently, the heat generated by the first electronic component 11 may be transferred to the surroundings of the package structure 1 through the thermal conduction structures 15. In some embodiments, the plural thermal conduction structures 15 are implemented by a metallic lead frame. Since the metallic lead frame is made of a metallic material, the plural thermal conduction structures 15 not only improve the thermal and electrical properties but also provide a mechanical support to further enhance the strength of the package structure 1.

A process of fabricating the package structure 1 of the present invention will be illustrated as follows. Firstly, the first electronic component 11 and the thermal conduction structures 15 are disposed on a thermal release film (not shown). Then, the first insulation layer 10 is laminated on the thermal release film. Consequently, the first electronic component 11 and the thermal conduction structures 15 are covered by the first insulation layer 10, and the first conducting terminals 110 of the first electronic component 11 are located beside and exposed to the bottom surface 100 of the first insulation layer 10. Then, the thermal release film is removed. Then, the first conducting terminals 110 of the first electronic component 11 exposed to the bottom surface 100 of the first insulation layer 10 are subjected to a plasma cleaning process. Consequently, the native oxide formed on the first conducting terminals 110 is removed. Moreover, the plasma cleaning process may be slightly modified according to the type of the metallic material of the first conducting terminals 110. Then, the first metal layer 13 is formed on the bottom surface 100 of the first insulation layer 10 and contacted with the first conducting terminals 110 by a sputtering process or an electro-less plating process. Then, a copper electroplating process is performed to form the second metal layer 14 on the bottom surface 130 of the first metal layer 13. The first metal layer 13 and the second metal layer 14 are defined as a first re-distribution layer 12. Afterwards, the first metal layer 13 and the second metal layer 14 are etched according to the relationships between the first conducting terminals 110 of the first electronic component 11 and the corresponding traces of the system circuit board. Consequently, the first metal layer 13 and the second metal layer 14 are patterned to form one or more conductive traces. Namely, the first metal layer 13 is divided into plural separate first conductive traces 131, and the second metal layer 14 is divided into plural separate second conductive traces 140. Consequently, the first conducting terminals 110 of the first electronic component 11 are electrically connected with the system circuit board through the corresponding first conductive traces 131 and the corresponding second conductive traces 140.

It is noted that numerous modifications and alterations of the package structure 1 may be made while retaining the teachings of the invention. Hereinafter, some variant examples of the package structure 1 will be illustrated with reference to FIGS. 2-5. Component parts and elements corresponding to those of the first embodiment are designated by identical numeral references, and detailed descriptions thereof are omitted.

Figure 2A:
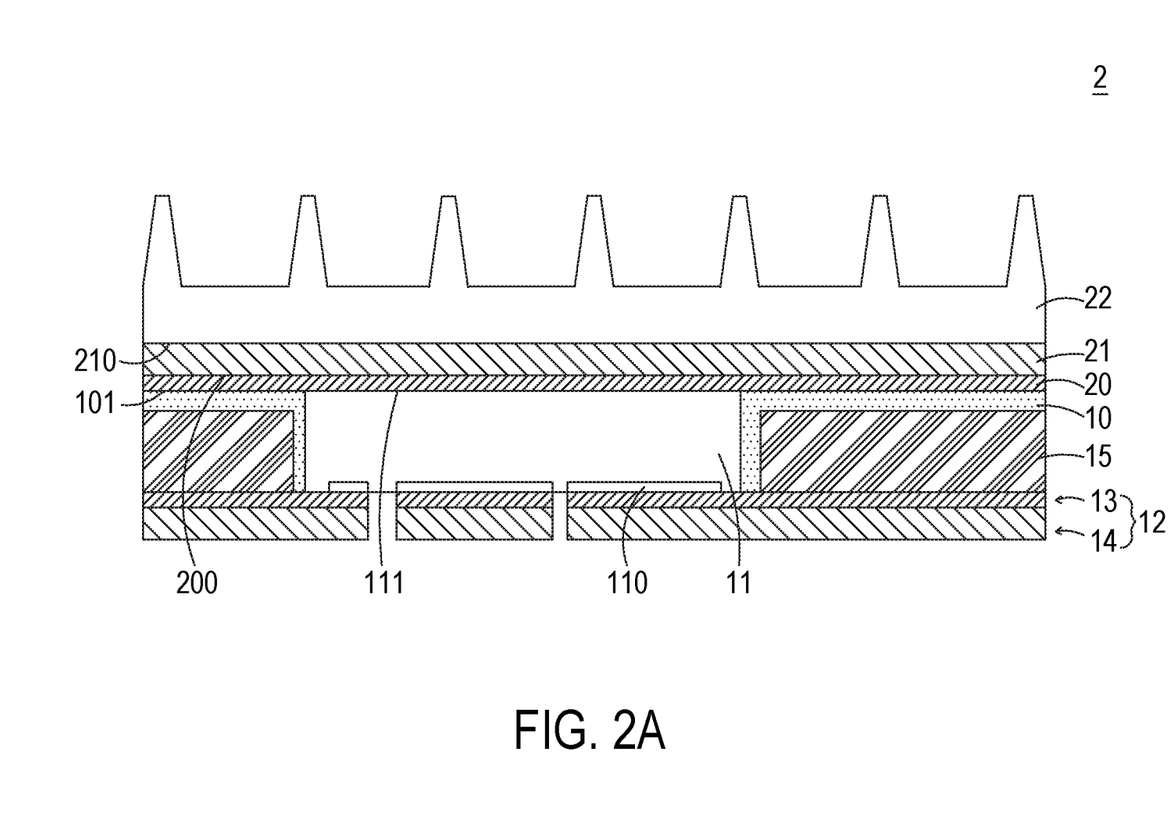
FIG. 2A is a schematic cross-sectional view illustrating a package structure according to a second embodiment of the present invention.

FIG. 2A is a schematic cross-sectional view illustrating a package structure according to a second embodiment of the present invention. In comparison with the first embodiment shown in FIG. 1, the package structure 2 of this embodiment further comprises a third metal layer 20, a heat dissipation layer 21 and a heat dissipation device 22. The heat dissipation device 22 is used for enhancing the heat dissipation efficiency of the package structure 2. The third metal layer 20 is disposed on a top surface 101 of the first insulation layer 10. The heat dissipation layer 21 is disposed on a top surface 200 of the third metal layer 20. Moreover, the heat dissipation device 22 is attached on a top surface 210 of the heat dissipation layer 21 by a thermally conductive adhesive (not shown), and the heat dissipation device 22 is located at an outer side of the package structure 2. During the operations of the first electronic component 11, the heat generated by the first electronic component 11 may be transferred to the heat dissipation device 22, the third metal layer 20 and the heat dissipation layer 21. Consequently, the heat is dissipated away by the heat dissipation device 22. The material and the forming method of the third metal layer 20 may be identical to those of the first metal layer 13, and are not redundantly described herein. The heat dissipation layer 21 may be made of a material with good heat dissipation properties.

The heat dissipation device 22 may be a passive heat dissipation device or an active heat dissipation device. An example of the passive heat dissipation device includes but is not limited to a heat sink, which is made of a metallic material or a ceramic material. An example of the active heat dissipation device includes but is not limited to cooling water or heat pipe.

Figure 2B:
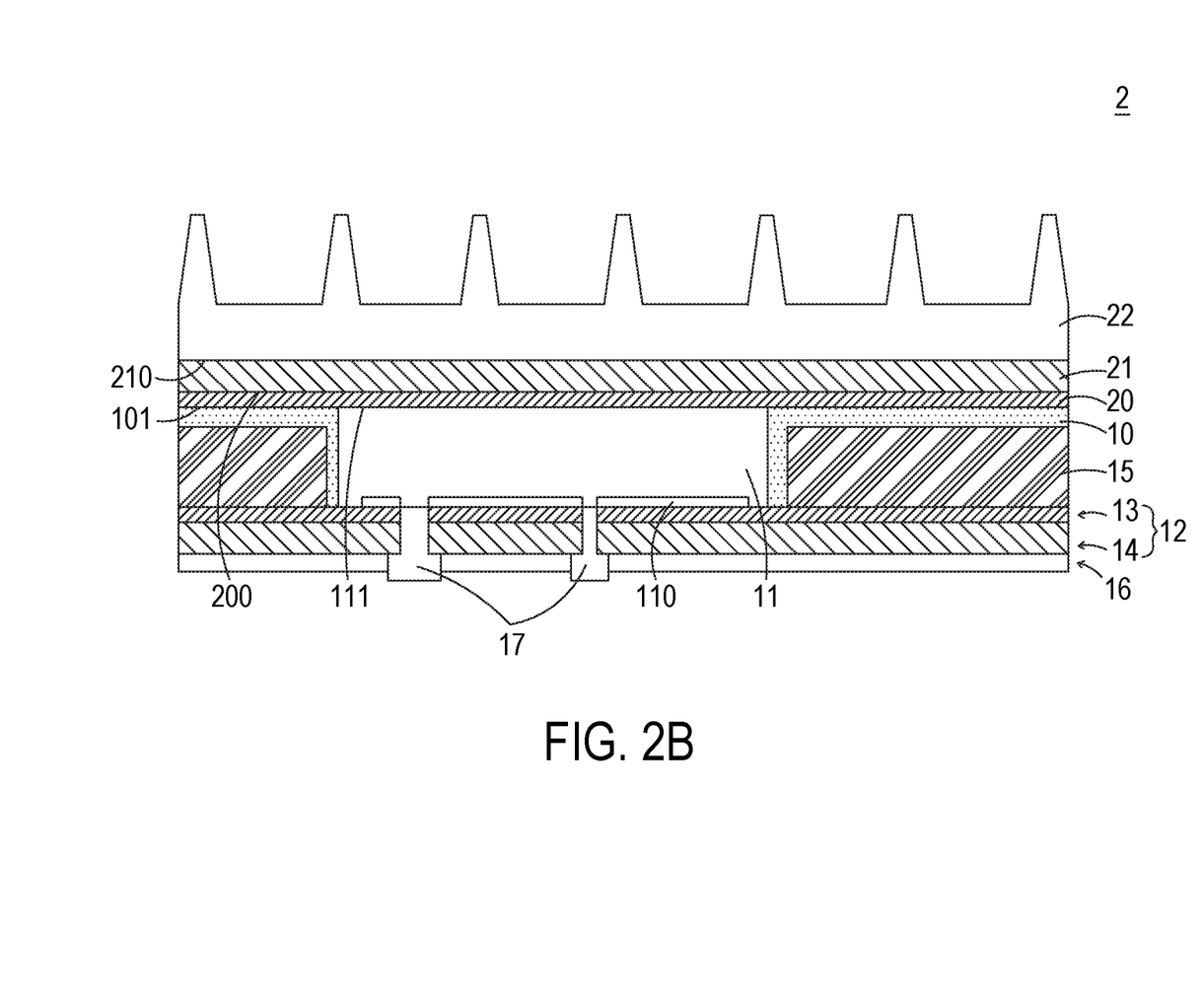
FIG. 2B is a schematic cross-sectional view illustrating a variant example of FIG. 2A.

FIG. 2B is a schematic cross-sectional view illustrating a variant example of FIG. 2A. As shown in FIG. 2B, the package structure 2 further comprises plural pads 16 disposed on the conductive traces and plural solder masks 17 disposed in the via hole of the first re-distribution layer 12 to prevent the oxidation of the first re-distribution layer 12 and solder bridging problem. In an embodiment, the pads 16 are made of Ni, Au, Sn, Pd, Pb, Ag, or a combination thereof, and the solder masks 17 are made of insulation materials, such as epoxy or polymer.

Since the first electronic component 11 is embedded within the first insulation layer 10, a part of the first insulation layer 10 may be arranged between the first electronic component 11 and the third metal layer 20. The part of the first insulation layer 10 between the first electronic component 11 and the third metal layer 20 may influence the efficiency of conducting the heat of the first electronic component 11 to the heat dissipation device 22 through the third metal layer 20 and the heat dissipation layer 21. In case that a part of the first insulation layer 10 is higher than the top surface 111 of the first electronic component 11, this part of the first insulation layer 10 may be removed by a grinding process or a polishing process if a package structure with a high thermal conductivity is required, as shown in FIGS. 2A and 2B. Consequently, the top surface 101 of the first insulation layer 10 is at the same level with the top surface 111 of the first electronic component 11. After the third metal layer 20 is disposed on the top surface 101 of the first insulation layer 10, the top surface 111 of the first electronic component 11 may be directly contacted with the third metal layer 20 (see FIGS. 2A and 2B). Consequently, the heat of the first electronic component 11 can be effectively transferred to the third metal layer 20.

Figure 3:
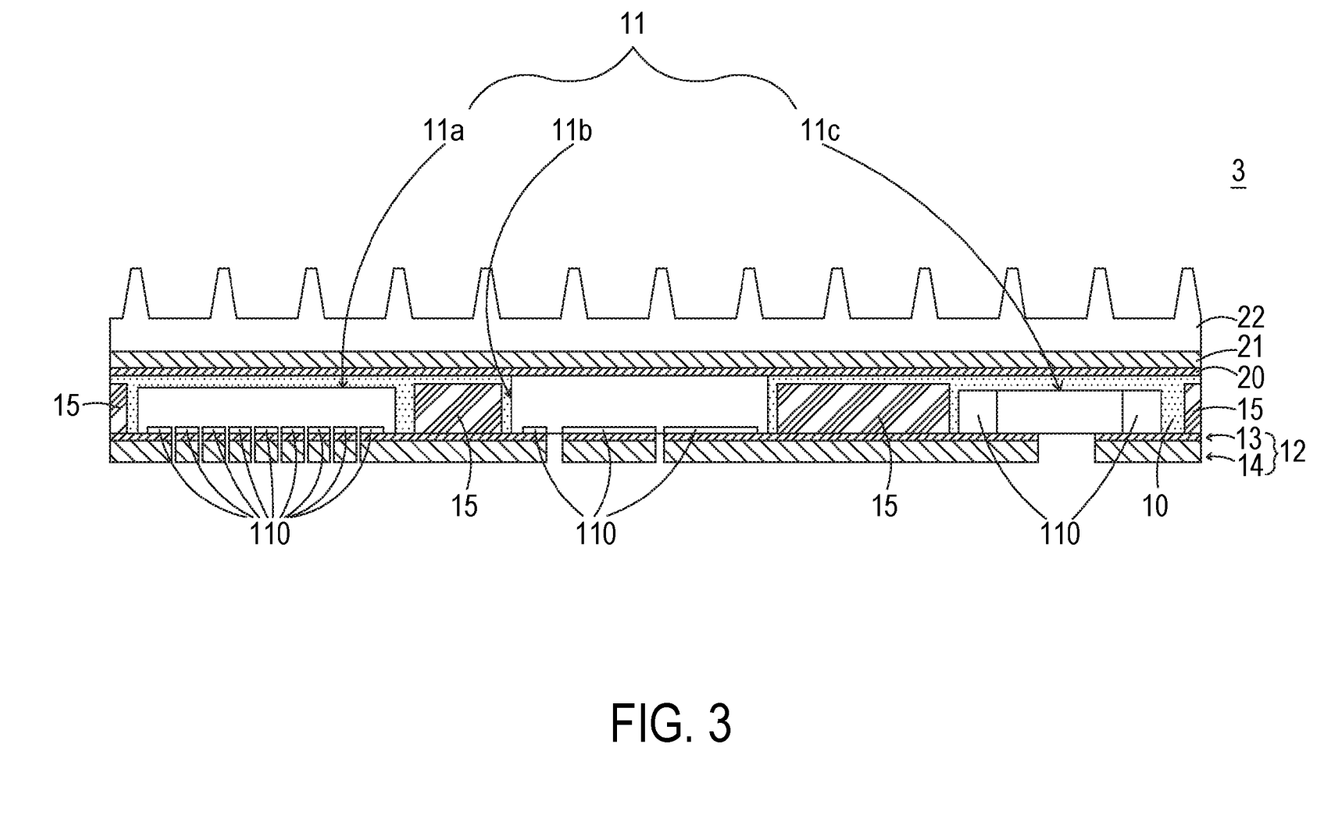
FIG. 3 is a schematic cross-sectional view illustrating a package structure according to a third embodiment of the present invention.

FIG. 3 is a schematic cross-sectional view illustrating a package structure according to a third embodiment of the present invention. In comparison with the second embodiment shown in FIG. 2A, the package structure 3 of this embodiment comprises plural first electronic components 11. The structures of the plural first electronic components 11 may be identical or different. For example, as shown in FIG. 3, the package structure 3 comprises three first electronic components 11a, 11b and 11c. The number of the first conducting terminals 110 of each first electronic component 11 is determined according to the type of the first electronic component 11. For example, the first electronic component 11a is a driver with nine first conducting terminals 110. Moreover, the first electronic component 11c has two first conducting terminals 110. For example, the first electronic component 11c is a capacitor, a resistor, a diode or any other appropriate passive component. Moreover, the first electronic component 11b is an integrated circuit (IC) chip. The number of the first conducting terminals 110 may be determined according to the configuration of the IC chip. For example, the first electronic component 11b has three first conducting terminals 110. It is noted that the number of the first electronic components 11 within the package structure 3 may be varied according to the practical requirements.

Moreover, the package structure 3 comprises plural thermal conduction structures 15. In this embodiment, every two thermal conduction structures 15 are horizontally located at bilateral sides of every first electronic component 11. That is, one thermal conduction structure 15 is arranged between every two adjacent electronic components 11. In another embodiment, the thermal conduction structures 15 are integrated as a lead frame with a plurality of openings or holes. Each of holes or openings accommodates one or more electric components 11.

Figure 4:
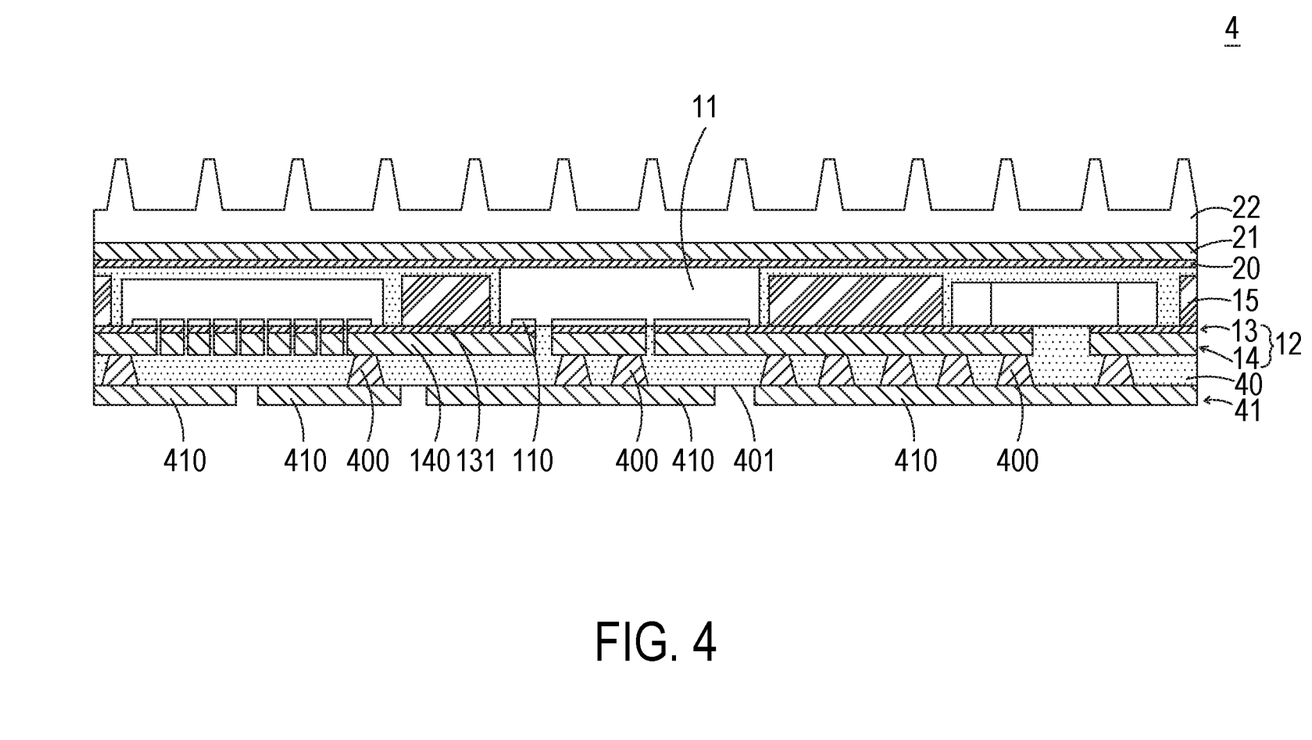
FIG. 4 is a schematic cross-sectional view illustrating a package structure according to a fourth embodiment of the present invention.

FIG. 4 is a schematic cross-sectional view illustrating a package structure according to a fourth embodiment of the present invention. In comparison with the third embodiment shown in FIG. 3, the package structure 4 of this embodiment further comprises a second insulation layer 40 and a second re-distribution layer 41. The second insulation layer 40 is disposed on the second metal layer 14 of the first re-distribution layer 12, and the first re-distribution layer 12 is covered by the second insulation layer 40. Moreover, plural first conductive vias 400 are formed in the second insulation layer 40. The plural first conductive vias 400 are contacted with corresponding second conductive traces 140 of the first re-distribution layer 12. The second re-distribution layer 41 is disposed on a bottom surface 401 of the second insulation layer 40 and partially exposed to the bottom surface 401 of the second insulation layer 40. Moreover, by etching the second re-distribution layer 41, the second re-distribution layer 41 is divided into one or more separate third conductive traces 410. As shown in FIG. 4, the second re-distribution layer 41 comprises four separate third conductive traces 410. Each third conductive trace 410 is contacted with at least one first conductive via 400. Consequently, the second conductive traces 140 are electrically connected with the corresponding third conductive traces 410 of the second re-distribution layer 41. Moreover, since the first conducting terminals 110 of the first electronic component 11 are electrically connected with the corresponding second conductive traces 140 through the corresponding first conductive traces 131, the first conducting terminals 110 of the first electronic component 11 are electrically connected with the corresponding third conductive traces 410 through the corresponding first conductive traces 131, the corresponding second conductive traces 140 and the corresponding first conductive vias 400. The third conductive traces 410 may be served as contact pads of the package structure 4. Consequently, the package structure 4 may be mounted on a system circuit board (not shown) by a surface mount technology.

As mentioned above, the package structure 4 comprises the first re-distribution layer 12 and the second re-distribution layer 41. Moreover, the second conductive traces 140 of the first re-distribution layer 12 are electrically connected with the third conductive traces 410 of the second re-distribution layer 41 through the corresponding first conductive vias 400. Consequently, by changing the positions and the numbers of the third conductive traces 410 and the first conductive vias 400, the connecting relationships between the first conducting terminals 110 of the first electronic component 11, the third conductive traces 410 and the first conductive vias 400 are more diverse. Consequently, the package structure 4 may be applied to the system circuit board with various trace configurations. Under this circumstance, the applications of the package structure 4 are enhanced.

The method of forming the first conductive vias 400 is well known to those skilled in the art. For example, after plural vias are formed in the second insulation layer 40 by a laser drilling process, a mechanical drilling process or a photolithography process and a conductive material is formed in the plural vias by a filling process or an electroplating process, the first conductive vias 400 are formed.

Figure 5:
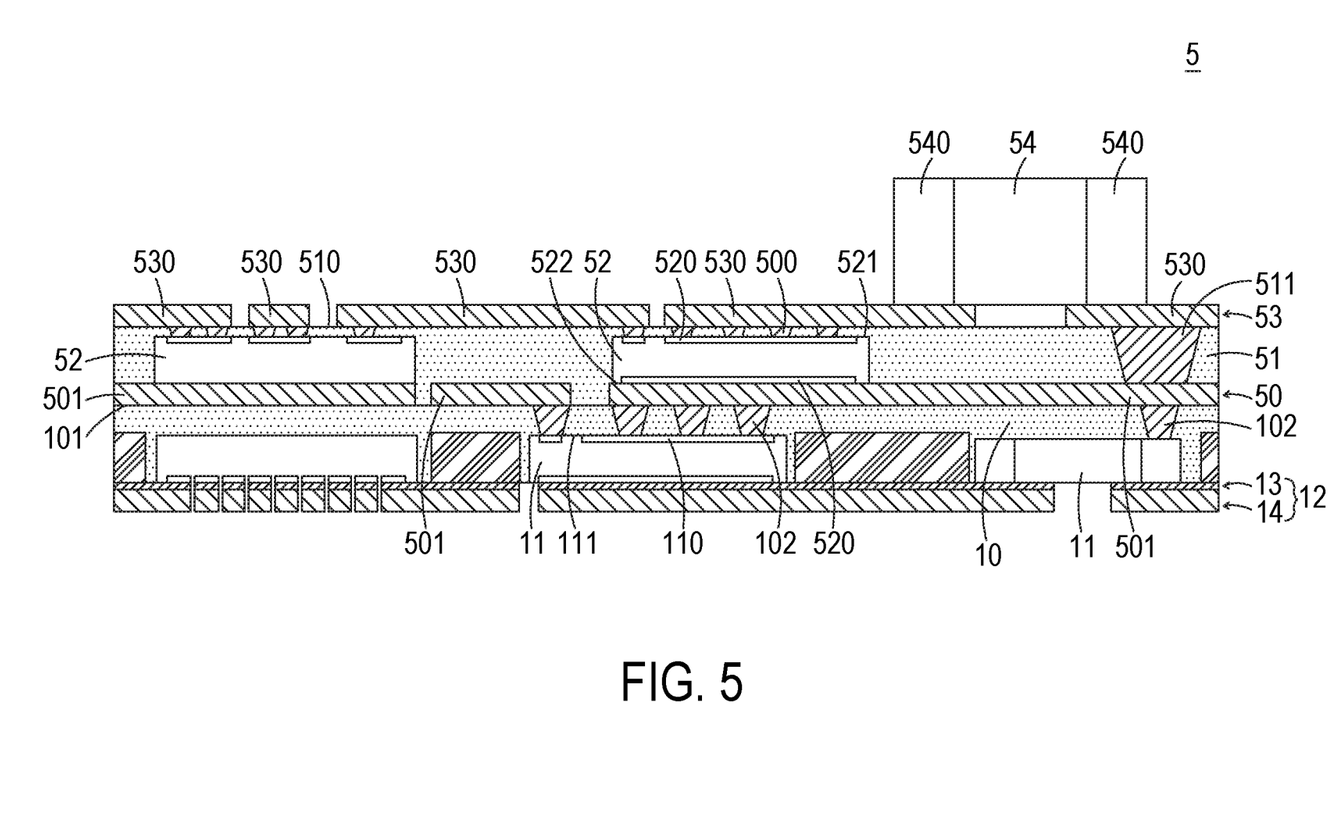
FIG. 5 is a schematic cross-sectional view illustrating a package structure according to a fifth embodiment of the present invention.

FIG. 5 is a schematic cross-sectional view illustrating a package structure according to a fifth embodiment of the present invention. In comparison with the first embodiment shown in FIG. 1, plural second conductive vias 102 are further formed in the first insulation layer 10 of the package structure 5 of this embodiment. The second conductive vias 102 are contacted with the corresponding first conducting terminals 110 on the top surface 111 of the first electronic component 11. Moreover, the package structure 5 of this embodiment further comprises a first conductive layer 50, a third insulation layer 51, at least one second electronic component 52 and a second conductive layer 53. The first conductive layer 50 is disposed on the top surface 101 of the first insulation layer 10. Moreover, a part of the top surface 101 of the first insulation layer 10 is covered by the first conductive layer 50. Moreover, the first conductive layer 50 is contacted with the second conductive vias 102. Consequently, the first conductive layer 50 is electrically connected with the first conducting terminals 110 on the top surface 111 of the first electronic component 11 through the second conductive vias 102.

The third insulation layer 51 is disposed on the first conductive layer 50, and the first conductive layer 50 is covered by the third insulation layer 51. Moreover, plural third conductive vias 500 are formed in the third insulation layer 51. The second conductive layer 53 is disposed on a top surface 510 of the third insulation layer 51, and a part of the top surface 510 of the third insulation layer 51 is exposed through the second conductive layer 53. Moreover, the second conductive layer 53 is contacted with the third conductive vias 500. The second electronic component 52 is embedded within the third insulation layer 51, and disposed on the first conductive layer 50. The second electronic component 52 comprises at least one second conducting terminal 520. The second conducting terminal 520 on a top surface 521 of the second electronic component 52 is contacted with the corresponding third conductive via 500. The second conducting terminal 520 on a bottom surface 522 of the second electronic component 52 is directly disposed on the first conductive layer 50 and contacted with the first conductive layer 50. Consequently, the second electronic component 52 is electrically connected with the second conductive layer 53 through the second conducting terminals 520 on the top surface 521 of the second electronic component 52 and the third conductive vias 500, and/or the second electronic component 52 is electrically connected with the first conductive layer 50 through the second conducting terminal 520 on the bottom surface 522 of the second electronic component 52. Since the first electronic component 11 is electrically connected with the first conductive layer 50 and the second electronic component 52 is also electrically connected with the first conductive layer 50, the first conducting terminals 110 of the first electronic component 11 and the second conducting terminals 520 of the second electronic component 52 are electrically connected with each other through the first conductive layer 50.

Moreover, by etching the first conductive layer 50, the first conductive layer 50 is divided into one or more separate fourth conductive traces 501. Similarly, by etching the second conductive layer 53, the second conductive layer 53 is divided into one or more separate fifth conductive traces 530. As shown in FIG. 5, the first conductive layer 50 comprises three separate fourth conductive traces 501. The fourth conductive traces 501 are contacted with the corresponding second conductive vias 102. The fifth conductive traces 530 are contacted with the corresponding third conductive vias 500.

In this embodiment, the package structure 5 is a multi-layered structure with the first insulation layer 10 and the third insulation layer 51, which are located at different levels. Consequently, the first electronic component 11 and the second electronic component 52 are embedded within the first insulation layer 10 and the third insulation layer 51, respectively. Since the first electronic component 11 and the second electronic component 52 are located at different levels, the distance between the first electronic component 11 and the second electronic component 52 is effectively shortened. Under this circumstance, the electrical resistance is effectively reduced, the parasitic effect is reduced, the electrical property is enhanced, and the overall power density of the package structure 5 is largely increased.

Moreover, as shown in FIG. 5, at least one fourth conductive via 511 is formed in the third insulation layer 51. A first end of the fourth conductive via 511 is contacted with the corresponding fifth conductive trace 530, and a second end of the fourth conductive via 511 is contacted with the corresponding fourth conductive trace 501. After the heat generated by the first electronic component 11 is transferred to the first conductive layer 50 through the corresponding second conductive vias 102, a portion of the heat may be transferred to the second conductive layer 53 through the fourth conductive via 511. Consequently, the heat dissipation efficiency is further increased. As mentioned above, the first conductive layer 50 and the second conductive layer 53 are electrically connected with each other through the fourth conductive via 511. Consequently, if the second conducting terminals 520 of the second electronic component 52 are contacted with the corresponding fourth conductive trace 501, the second conducting terminals 520 of the second electronic component 52 are electrically connected with the second conductive layer 53 through the fourth conductive via 511 (see FIG. 5).

The methods of forming the second conductive vias 102, the third conductive vias 500 and the fourth conductive via 511 are similar to the method of forming the first conductive vias 400 of FIG. 4, and are not redundantly described herein.

In this embodiment, the first conductive layer 50 and the second conductive layer 53 may be made of copper or any other appropriate electrically conductive material. In addition, the materials of the first conductive layer 50 and the second conductive layer 53 may be identical or different. An example of each of the first electronic component 11 and the second electronic component 52 includes but is not limited to an integrated circuit chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. Moreover, the types of the first electronic component 11 and the second electronic component 52 may be identical or different.

Moreover, as shown in FIG. 5, the package structure 5 further comprises at least one third electronic component 54. The third electronic component 54 is disposed on the second conductive layer 53. The third electronic component 54 comprises plural third conducting terminals 540. The third conducting terminals 540 are disposed on the corresponding fifth conductive traces 530 of the second conductive layer 53. In particular, the third conducting terminals 540 may be fixed on the corresponding fifth conductive traces 530 by a solder paste welding process. Consequently, the power density of the package structure 5 is enhanced.

From the above descriptions, the present invention provides a package structure. The package structure comprises an electronic component, and a re-distribution layer. The conducting terminals of the electronic component are contacted with the re-distribution layer. Consequently, the conducting terminals of the electronic component are electrically connected with the external circuit through the re-distribution layer. Under this circumstance, the conducting terminals of the electronic component may be made of a non-copper metallic material. Consequently, for allowing the first conducting terminals of the first electronic component to be electrically connected with the external circuit, it is not necessary to form conductive vias in the package structure. In other words, the laser drilling process and the desmearing process to treat the package structure can be omitted by the technology of the present invention. Since it is not necessary to additionally treat the first conducting terminals of the first electronic component, the applications of the package structure of the present invention are more extensive. Moreover, since the laser drilling process and the desmearing process are omitted, the method of fabricating the package structure of the present invention is simplified. In some embodiments, the package structure comprises a first re-distribution layer and a second re-distribution layer. The first re-distribution layer and the second re-distribution layer are electrically connected with each other through first conductive vias. Consequently, by changing the positions and the numbers of the third conductive traces and the first conductive vias, the package structure may be applied to the system circuit board with various trace configurations. Under this circumstance, the applications of the package structure are enhanced. Moreover, since the first electronic component and the second electronic component are located at different levels, the distance between the first electronic component and the second electronic component is effectively shortened. Under this circumstance, the electrical resistance is effectively reduced, the parasitic effect is reduced, the electrical property is enhanced, and the overall power density of the package structure is largely increased. Moreover, since an additional electronic component or a heat dissipation device may be located at an outer side of the package structure, the integration density of the package structure is increased and the heat dissipation efficiency is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
   a first insulation layer;
   at least one first electronic component embedded within the first insulation layer, the first electronic component comprising plural first conducting terminals disposed on a bottom surface thereof, wherein at least part of the bottom surface of the first electronic component is exposed from a bottom surface of the first insulation layer;
   a first re-distribution layer formed on the bottom surface of the first insulation layer and contacted with the corresponding first conducting terminals;
   a third metal layer formed on a top surface of the first insulation layer;
   a heat dissipation layer formed on a top surface of the third metal layer; and
   a heat dissipation device attached on a top surface of the heat dissipation layer and located at an outer side of the package structure.

2. The package structure according to claim 1, wherein the first conducting terminals are made of a non-copper metallic material.

3. The package structure according to claim 1, wherein the first insulating layer has a recess adjacent to the bottom surface thereof, and the first electronic component is disposed in the recess.

4. The package structure according to claim 1, wherein the first re-distribution layer comprises:
   a first metal layer disposed on the bottom surface of the first insulation layer; and
   a second metal layer disposed on a bottom surface of the first metal layer.

5. The package structure according to claim 4, wherein the first metal layer is made of copper, nickel-chromium alloy, Ti, TiW, Cr, Ni, or a combination thereof, and the second metal layer is made of copper.

6. The package structure according to claim 4, wherein the first metal layer comprises at least one first conductive trace contacted with the corresponding first conducting terminal, and the second metal layer comprises at least one second conductive trace contacted with the corresponding first conductive trace and electrically connected with the corresponding first conducting terminal through the corresponding first conductive trace.

7. The package structure according to claim 1, wherein the top surface of the first insulation layer is at the same level with a top surface of the first electronic component, and the top surface of the first electronic component is contacted with the third metal layer.

8. The package structure according to claim 6, further comprising:
   a second insulation layer disposed on the first re-distribution layer, wherein the first re-distribution layer is covered by the second insulation layer, and comprises at least one first conductive via, wherein the first conductive via is contacted with the corresponding second conductive trace; and
   a second re-distribution layer disposed on a bottom surface of the second insulation layer and partially exposed to the bottom surface of the second insulation layer.

9. The package structure according to claim 8, wherein the second re-distribution layer comprises at least one third conductive trace contacted with the corresponding first conductive via.

10. The package structure according to claim 6, wherein the first electronic component further comprises other plural first conducting terminals disposed on a top surface thereof, and wherein at least one second conductive via is formed in the first insulation layer, and contacted with the corresponding first conducting terminal on the top surface of the first electronic component.

11. The package structure according to claim 10, further comprising:
   a first conductive layer disposed on the top surface of the first insulation layer, wherein a part of the top surface of the first insulation layer is covered by the first conductive layer, and the first conductive layer is contacted with the at least one second conductive via;
   a third insulation layer disposed on the first conductive layer, wherein the first conductive layer is covered by the third insulation layer, and at least one third conductive via is formed in the third insulation layer;
   a second conductive layer disposed on a top surface of the third insulation layer, wherein a part of the top surface of the third insulation layer is exposed through the second conductive layer, and the second conductive layer is contacted with the corresponding third conductive via; and
   at least one second electronic component embedded within the third insulation layer and disposed on the first conductive layer, wherein the second electronic component comprises plural second conducting terminals, wherein the plural second conducting terminals are contacted with the first conductive layer and/or the plural second conducting terminals are electrically connected with the second conductive layer through the at least one third conductive via.

12. The package structure according to claim 11, wherein the first conductive layer comprises at least one fourth conductive trace contacted with the corresponding second conductive via, and the second conductive layer comprises at least one fifth conductive trace contacted with the corresponding third conductive via.

13. The package structure according to claim 12, wherein at least one fourth conductive via is further formed in the third insulation layer, wherein a first end of the fourth conductive via is contacted with the corresponding fifth conductive trace, and a second end of the fourth conductive via is contacted with the corresponding fourth conductive trace.

14. The package structure according to claim 13, further comprising at least one third electronic component, wherein the third electronic component is disposed on the second conductive layer and comprises plural third conducting terminals, wherein each of the third conducting terminal is disposed on the corresponding fifth conductive trace.

* * * * *